US008161435B2

(12) United States Patent  
Manohar et al.

(10) Patent No.: US 8,161,435 B2
(45) Date of Patent: Apr. 17, 2012

(54) RESET MECHANISM CONVERSION

(75) Inventors: Rajit Manohar, Ithaca, NY (US); Clinton W. Kelly, San Jose, CA (US); Virantha Ekanayake, San Jose, CA (US); Gael Paul, Aix-en-Provence (FR)

(73) Assignee: Achronix Semiconductor Corporation, Santa Clara, CA (US)

( * ) Notice: Subject to any disclaimer, the term of this patent is extended or adjusted under 35 U.S.C. 154(b) by 346 days.

(21) Appl. No.: 12/505,653

(22) Filed: Jul. 20, 2009

(65) Prior Publication Data

US 2011/0016439 A1 Jan. 20, 2011

(51) Int. Cl.
G06F 17/50 (2006.01)
H01L 25/00 (2006.01)
H03K 19/00 (2006.01)

(52) U.S. Cl. ............ 716/103; 716/107; 716/132; 73/16; 326/41; 326/47; 326/101; 326/93

(58) Field of Classification Search .................. 716/103, 716/107, 132; 703/16; 326/41, 47, 101, 326/93

See application file for complete search history.

(56) References Cited

U.S. PATENT DOCUMENTS

| 5,067,091 | A | 11/1991 | Nakazawa |
| 6,301,655 | B1 | 10/2001 | Manohar et al. |
| 6,381,692 | B1 | 4/2002 | Martin et al. |
| 6,625,797 | B1 | 9/2003 | Edwards et al. |
| 6,658,550 | B2 | 12/2003 | Martin |
| 6,690,203 | B2 | 2/2004 | Nystrom et al. |
| 7,157,934 | B2 | 1/2007 | Teifel |
| 7,418,676 | B2 | 8/2008 | Karaki et al. |
| 7,464,361 | B2 | 12/2008 | Sandbote |
| 7,594,211 | B1 * | 9/2009 | Tian et al. ............. 716/113 |
| 7,610,567 | B2 | 10/2009 | Manohar |
| 7,614,029 | B2 | 11/2009 | Manohar |
| 2002/0156995 | A1 | 10/2002 | Martin et al. |
| 2002/0166003 | A1 | 11/2002 | Nystrom et al. |
| 2005/0160392 | A1 | 7/2005 | Sandbote |
| 2005/0198606 | A1 | 9/2005 | Gupta et al. |
| 2006/0075210 | A1 | 4/2006 | Manohar et al. |
| 2006/0120189 | A1 | 6/2006 | Beerel et al. |
| 2006/0190851 | A1 | 8/2006 | Karaki et al. |
| 2006/0233006 | A1 | 10/2006 | Fant |

(Continued)

FOREIGN PATENT DOCUMENTS

KR 101061864 9/2011

(Continued)

OTHER PUBLICATIONS

Awerbuch et al., "A Time-Optimal Self-Statbilizing Synchronizer Using a Phase Clock", IEEE Transactions on Dependable and Secure Computing, vol. 4, No. 3, Jul.-Sep. 2007, pp. 180-190.*

(Continued)

Primary Examiner — Phallaka Kik
(74) Attorney, Agent, or Firm — Schwegman, Lundberg & Woessner, P.A.

(57) ABSTRACT

Methods, circuits, and systems for converting reset mechanisms in a synchronous circuit design into a corresponding asynchronous representation are described. These may operate to convert synchronous state holding blocks that include reset signals to corresponding asynchronous dataflow logic blocks. A replicated reset token at a fraction of the operational frequency of the reset signal may be distributed to the locations of the asynchronous dataflow logic blocks. Additional methods, circuits, and systems are disclosed.

24 Claims, 7 Drawing Sheets

U.S. PATENT DOCUMENTS

| | | | |
|---|---|---|---|
| 2007/0200608 | A1 | 8/2007 | Fang et al. |
| 2007/0253240 | A1 | 11/2007 | Manohar et al. |
| 2007/0256038 | A1 | 11/2007 | Manohar |
| 2007/0262786 | A1 | 11/2007 | Manohar et al. |
| 2008/0168407 | A1 | 7/2008 | Manohar |
| 2009/0319962 | A1 | 12/2009 | Manohar |
| 2010/0005431 | A1 | 1/2010 | Manohar |

FOREIGN PATENT DOCUMENTS

| | | |
|---|---|---|
| WO | WO-2007127914 A3 | 11/2007 |
| WO | WO-2008085792 A2 | 7/2008 |
| WO | WO-2008085792 A3 | 7/2008 |

OTHER PUBLICATIONS

Chelcea et al., "Self-Resetting Lacthes for Asynchronous Micro-Pipellines", Design Automation Conference, Jun. 4-8, 2007, pp. 986-989.*

DeVanem, "Efficient Circuit Partitioning to Extend Cycle Simulation Beyond Synchronous Circuits", 1997 IEEE/ACM International Conference on COmputer-Aided Design, Nov. 9-13, 1997, pp. 154-161.*

Kim et al., "Relative Timing Based Verification of Timed Circuits and Systems", Proceedings of the Eighth International Symposium on Asynchronous Circuits and Systems, Apr. 8-11, 2002, pp. 115-124.*

Leenstra et al., "On the Design and Test of Asynchronous Macros Embedded in Synchronous Systems", 1989 Proceedings of International Test Conference, Aug. 29-31, 1989, pp. 838-845.*

Singhal et al., "The Case of Retiming With Explicit Reset Circuitry", 1996 IEEE/ACM International Conference on COmputer-Aided Design, Nov. 10-14, 1996, pp. 618-625.*

Wengao et al., "A Novel Low-Power Readout Structure for TDI ROIC", Proceedings of 5th International Conference on ASIC, vol. 1, Oct. 21-24, 2003, pp. 591-594.*

"U.S. Appl. No. 11/650,238, Non-Final Office Action mailed Apr. 17, 2009", 8 pgs.

"U.S. Appl. No. 11/650,238, Notice of Allowance mailed Jun. 23, 2009", 4 pgs.

"U.S. Appl. No. 11/650,238, Response filed May 26, 2009 to Non Final Office Action mailed Apr. 17, 2009", 13 pgs.

"U.S. Appl. No. 11/740,184 Response filed Feb. 19, 2009 to Non-Final Office Action mailed Nov. 19, 2008", 14 pgs.

"U.S. Appl. No. 11/740,184, Non-Final Office Action mailed Nov. 19, 2008", 14 pgs.

"U.S. Appl. No. 11/740,184, Notice of Allowance mailed Jun. 15, 2009", 4 pgs.

"International Application Serial No. PCT/US2007/089197, Search Report mailed Jun. 27, 2008", 4 pgs.

"International Application Serial No. PCT/US2007/089197, Written Opinion mailed Jun. 27, 2008", 7 pgs.

Amde, M., et al., "Automating the Design of an Asynchronous DLX Microprocessor", *DAC*, (2003), 502-507 pgs.

Blunno, J. C, et al., "Handshake protocols for de-synchronization", *Proc. of ASYNC'04*, (2004), 10 pgs.

Branover, A., et al., "Asynchronous Design By Conversion: Converting Synchronous Circuits into Asynchronous Ones", *Proc. of Date'04*, (2004), 06 pgs.

Fesquet, L., et al., "A Programmable logic architecture for prototyping clockless circuits", Field Programmable Logic and Applications, (Aug. 24-26, 2005), 293-298.

Linder, D. H, et al., "Phased Logic: Supporting The Synchronouus Design Paradigm With Delay-Insensitive Circuitry", *IEEE Transactions on Computers*, vol. 45, (Sep. 1, 1996), 1031-1044.

Manohar, et al., "An Asynchronous Dataflow FPGA Architecture", *IEEE Transactions on Computers, IEEE Service Centre*, Los Alamitos, vol. 53, (Nov. 1, 2004), 1376-1392.

Mercer, E. G, et al., "Stochastic cycle period analysis in timed circuits", The 2000 IEEE International Symposium on Circuits and Systems, 2000. Proceedings. ISCAS 2000 Geneva. vol. 2, (2000), 172-175.

Mercer, Eric, et al., "Stochastic cycle period analysis in times circuits", *University of Utah Masters Thesis*, Electrical Engineering Department, University of Utah, (May 1999), 78 pgs.

Oberg, J., et al., "Automatic synthesis of Asynchronous Circuits From Synchronous RTL Descriptions", *Norchip Conference*, (Nov. 21, 2005), 1-6.

Peng, Song, et al., "Automated synthesis for asynchronic FPGAs", *Published in Symposium on Field Programmable Gate Arrays; Computer Systems Laboratory*, Cornell University, Ithaca NY, (2005), 11 pgs.

Teifel, John, et al., "Static Tokens: Using Dataflow to Automate Concurrent Pipeline Synthesis", *In 10th Int'l Symposium on Advanced Research in in Asynchronous Circuits and Systems*, pp. 17-27, Computer Systems Laboratory, Cornell University, Ithaca, NY, (Apr. 2004), 11 pgs.

Traver, C., et al., "Cell designs for self-timed FPGAs", 14th Annual IEEE International, (Sep. 12, 2001), 175-179.

"U.S. Appl. No. 11/650,238, Examiner Interview Summary mailed May 5, 2009", 2 pgs.

"International Application Serial No. PCT/US07/67618, Written Opinion mailed Feb. 22, 2008", 4 pgs.

"International Application Serial No. PCT/US2007/067618, International Preliminary Report on Patentability mailed Nov. 6, 2008", 7 pgs.

"International Application Serial No. PCT/US2007/067618, International Search Report mailed Feb. 22, 2008", 1 pg.

"Korean Application No. 10-2008-7029013, Office Action Response Filed Nov. 1, 2010", w/English translation, 11 pgs.

"Korean Application No. 10-2008-7029013, Office Action mailed Aug. 31, 2010", (w/ English Summary), 4 pgs.

Branover, A., et al., "Asynchronous Design by Conversion: Converting Synchronous Circuits into Asynchronous Ones", Proceedings of the Design, Automation and Test in Europe Conference and Exhibition, (2004), 6 pgs.

"U.S. Appl. No. 12/550,582, Non Final Office Action mailed Sep. 15, 2011", 13 pgs.

"U.S. Appl. No. 12/555,903, Non Final Office Action mailed Sep. 27, 2011", 8 pgs.

* cited by examiner

RESET MECHANISM CONVERSION

BACKGROUND

Traditional synchronous circuit designs may be represented using a variety of hardware description languages, higher level description languages, netlists, and schematics. All of these synchronous representations define the functionality of the circuits in the presence of a timing signal used to synchronize operations. Synchronous operations have several advantages, including deterministic behavior, simplified design and testing, and portability. However, there are also occasions when it is desirable to make use of asynchronous operations.

BRIEF DESCRIPTION OF THE DRAWINGS

Some embodiments of the disclosed technology are illustrated by way of example and not limitation in the figures of the accompanying drawings in which.

DETAILED DESCRIPTION

Example methods and systems for converting a reset mechanism in a synchronous circuit design into a corresponding asynchronous representation will now be described. In the following description, numerous examples having example-specific details are set forth to provide an understanding of example embodiments. It will be evident, however, to one of ordinary skill in the art that the present examples may be practiced without these example-specific details, and/or with different combinations of the details than are given here. Thus, specific embodiments are given for the purpose of simplified explanation, and not limitation.

Some example embodiments described herein may include a method comprising converting a synchronous circuit design having synchronous state holding blocks into an equivalent asynchronous design using a processor. The processor may be used to identify synchronous state holding blocks that include a reset signal. As part of the conversion process, these synchronous state holding blocks may be converted to corresponding asynchronous dataflow logic blocks that include reset inputs.

Nodes in the dataflow graph that describes an asynchronous circuit operate on data values, referred to as tokens. A token may comprise a data item that can flow through a pipeline. A token may comprise a one-bit value or a multi-bit value. In some embodiments, a replicated reset token may be distributed to the asynchronous dataflow logic block locations. The replicated reset token may operate at a fraction of the operational frequency of the reset signal. Conversion of synchronous circuits that can be performed in this way, and in other ways, will now be described.

Figure 1:
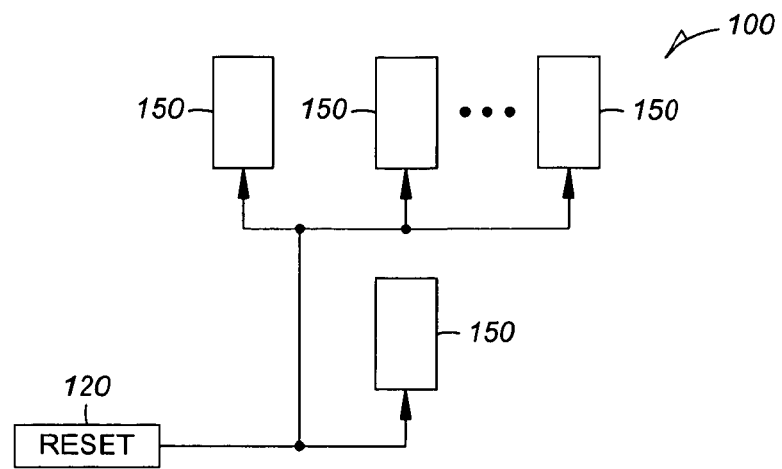
FIG. 1 is a diagram illustrating reset signal distribution in the synchronous netlist of a synchronous circuit, according to various embodiments of the invention.

FIG. 1 is a diagram illustrating reset signal 120 distribution in a synchronous netlist 100 of a synchronous circuit, according to various embodiments of the invention. The synchronous netlist 100 may include a number of synchronous state holding blocks 150 (e.g. flip-flops). A reset signal 120 may be distributed to reset inputs of the synchronous state holding blocks 150. The reset signal 120 may be used to synchronize the synchronous state holding blocks 150 by resetting clocks in each of the corresponding clock domains.

Figure 2:
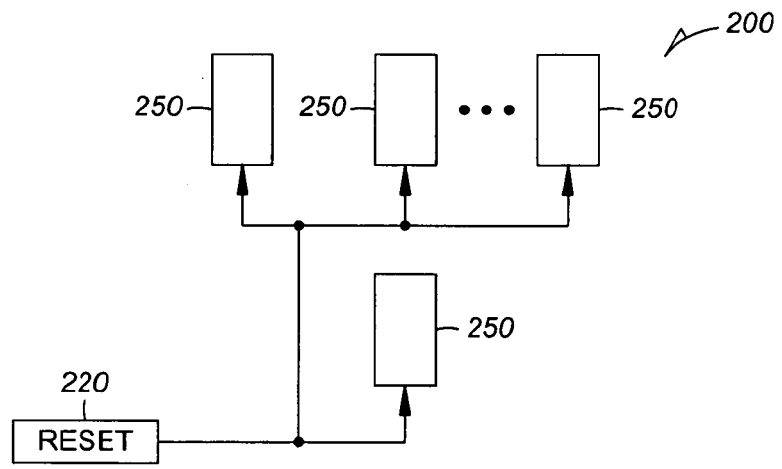
FIG. 2 is a diagram illustrating reset signal distribution in an asynchronous netlist corresponding to the synchronous netlist of FIG. 1, according to various embodiments of the invention.
Figure 5:
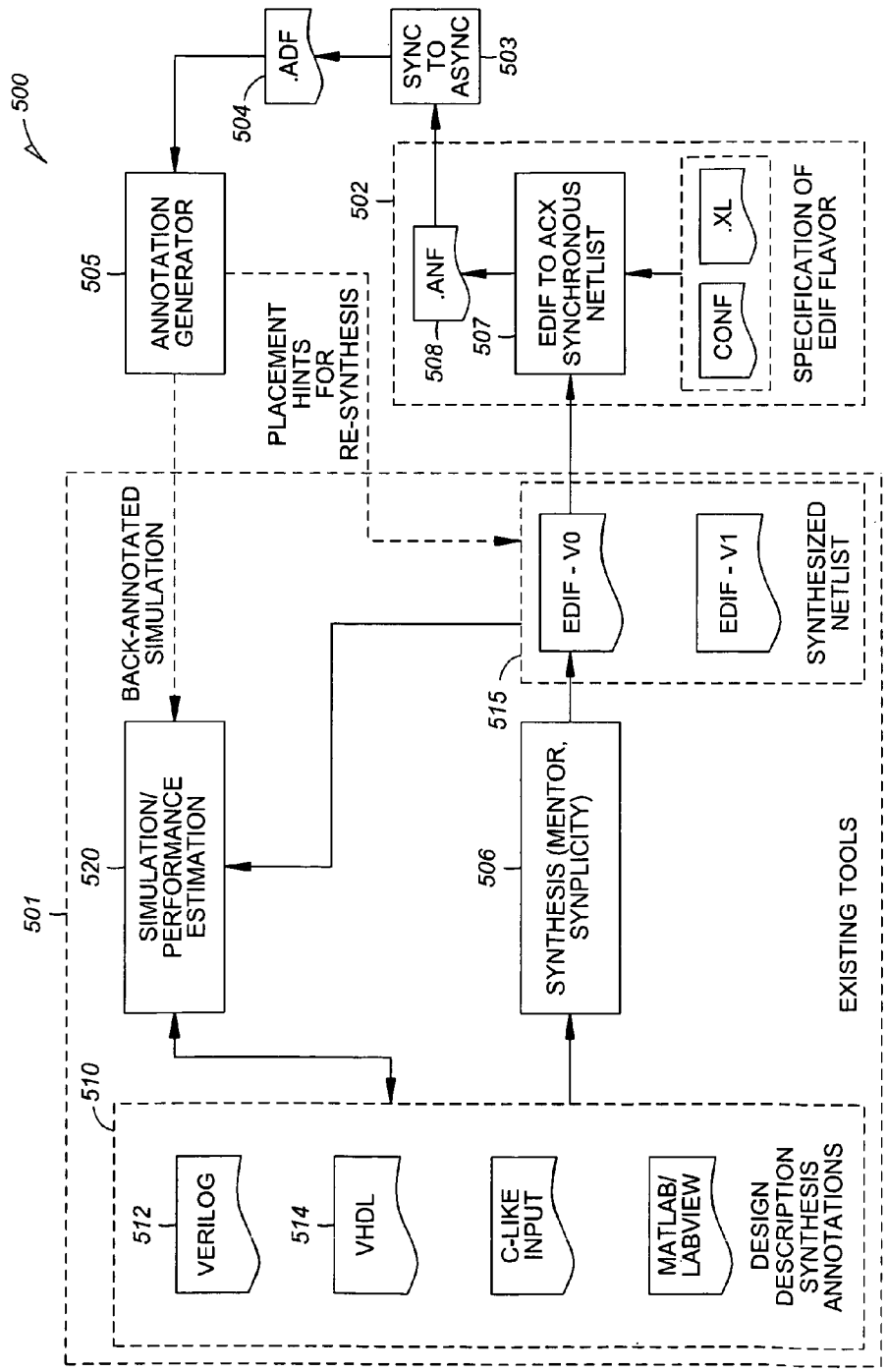
FIG. 5 is a block diagram illustrating a system for converting a synchronous netlist to an asynchronous netlist, according to various embodiments of the invention.

FIG. 2 is a diagram illustrating reset signal distribution in an asynchronous netlist 200 corresponding to the synchronous netlist 100 of FIG. 1, according to various embodiments of the invention. The asynchronous netlist 200 may result from conversion of the synchronous netlist 100 into a functionally equivalent corresponding asynchronous netlist. A high-level flow for the conversion method is shown in FIG. 5 and will be described below. Each of the state holding blocks 150 of FIG. 1 may be converted to an equivalent dataflow logic block 250. Dataflow logic blocks that can be used in conversion of synchronous circuits are shown and described below with respect to FIG. 6.

The synchronous to asynchronous conversion operation preformed to convert the synchronous netlist 100 into the asynchronous netlist 200 can be effected so that the reset mechanism itself remains unchanged. That is to say, the same reset signal 120 of FIG. 1 can first be converted to a reset token 220 and distributed to the reset inputs of the dataflow logic block 250 in the asynchronous netlist 200. However, a drawback of this scheme may relate to the inefficiency introduced by copying the reset token 220 to a large number of destinations, even though most of the time the reset signal 120 of FIG. 1 is known to be inactive.

For example, this may result in an increase in power consumption, as well as a problem in routing copies of the reset token 220 to a large number of destinations. In the worst case, the reset token can be copied to dataflow logic blocks 250 corresponding to every state holding block 150 of FIG. 1 including a clock domain that uses the reset signal 120. Thus, additional approaches for converting the reset mechanism in a synchronous design into an equivalent asynchronous representation will be described.

Figure 3:
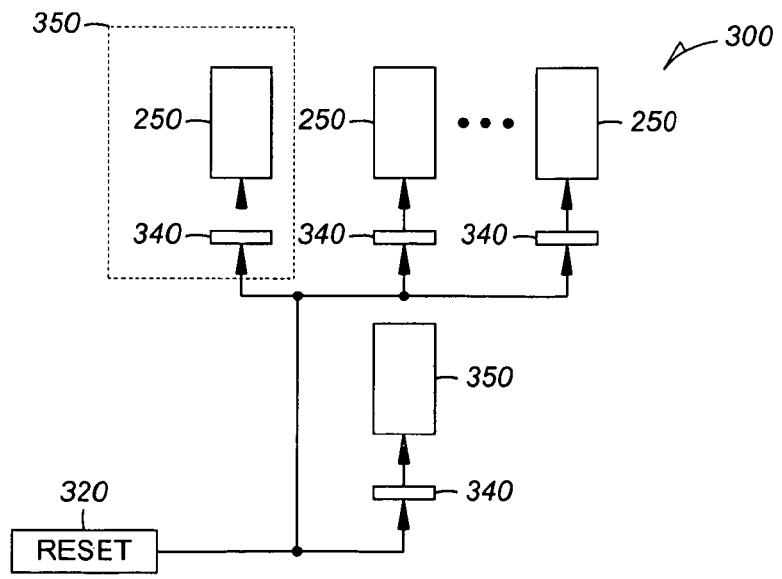
FIG. 3 is a diagram illustrating reset signal distribution in a modified asynchronous netlist of the synchronous circuit of FIG. 1, according to various embodiments of the invention.

FIG. 3 is a diagram illustrating reset signal distribution in a modified asynchronous netlist 300 of the synchronous circuit of FIG. 1, according to various embodiments of the invention. The modified asynchronous netlist 300 may be distinguished from the asynchronous netlist 200 in two ways. First, a replicated reset token 320 may be distributed through the modified asynchronous netlist 300. Second, the dataflow logic block 250 may be modified as shown with respect to block 350 of FIG. 3.

The proposed modification in the reset token may comprise a reduction in the operational frequency of the reset token 220 by a fixed (e.g., 8), or programmable factor to generate the replicated reset token 320. This can be implemented by the introduction of special circuitry to handle the operational frequency conversion at the input point where the reset signal 120 is initially be received. The operational frequency conversion may be performed by using a wrap-around counter or other methods known in the art. At the reset token destination, such as the location of the dataflow logic block 250 of FIG. 2, an upsampler 340, as shown in block 350 and described in more detail with respect to FIG. 9, upsamples the reset token 320 by the same factor and provides it to the dataflow logic block 250.

Figure 4:
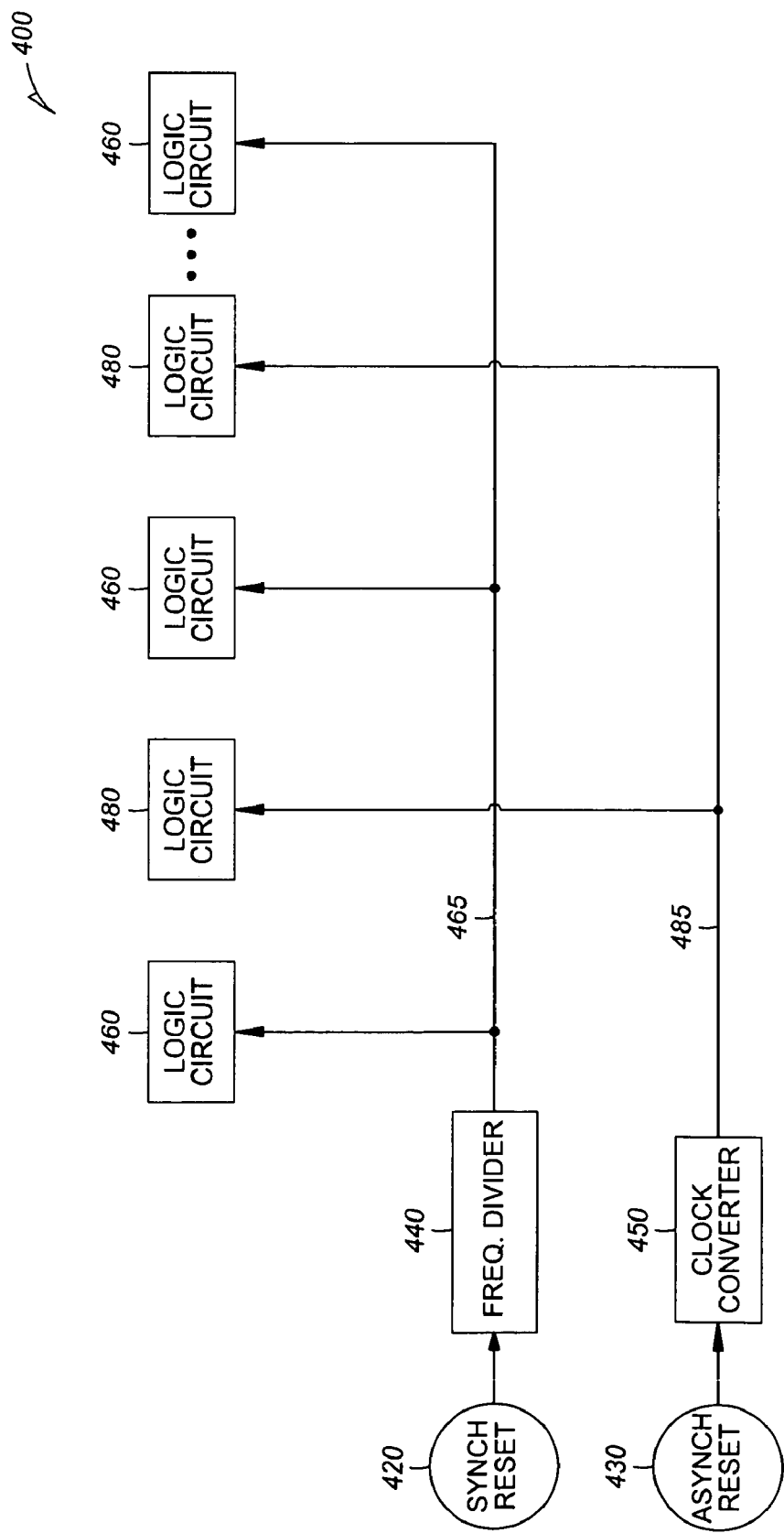
FIG. 4 is a diagram illustrating synchronous and asynchronous reset token distribution in an asynchronous circuit, according to various embodiments of the invention.

FIG. 4 is a diagram illustrating synchronous and asynchronous reset token distributions in an asynchronous circuit 400, according to various embodiments of the invention. Some of the state holding blocks in the asynchronous circuit 400, for example, the logic circuits 480, may receive asynchronous reset signals 485, whereas others, such as the logic circuits 460, may be synchronized with synchronous reset signals 465. According to example embodiments, the asynchronous reset signal 465 may be provided by frequency divider 440, which divides the operational frequency of a synchronous reset signal 420. The resulting fraction may be a fixed number (e.g., 8) or a programmable variable.

The asynchronous reset signal 485 may be produced from the asynchronous reset signal 430 using the clock converter 450. Since the asynchronous reset signal 485 may not be in the same clock domain as the logic circuits 480, an interface circuit such as the clock converter 450 may be used to convert the operational frequency of the asynchronous reset signal 485 into the operational frequency of a clock domain corresponding to the logic circuits 480.

In some example embodiments, the clock converter 450 may, in addition, perform the role of the frequency divider 440 and divide the converted frequency of the asynchronous signal by the same fraction. The logic circuits 460 and 480 may be designated as part of an asynchronous netlist resulting from conversion of synchronous netlists comprising state holding blocks. The process of converting synchronous netlists to asynchronous netlists will be described in the following FIGS. 5 to 7.

FIG. 5 is a block diagram illustrating a system 500 for converting a synchronous netlist to an asynchronous netlist, according to various embodiments of the invention. An input to the system 500 may be described in an existing hardware-description language (HDL) 510 such as Verilog 512, VHDL 514, or any other language that may be supported by the synchronous synthesis tools 506. Existing tools 501 can be used to simulate the high-level description, as well as synthesize it into a synchronous netlist (block 515) in a variety of formats including electronic design interchange format (EDIF) such as EDIF 200.

An EDIF reader tool 502 has been implemented that takes the EDIF as input, as well as a table that specifies "black-box" modules in the EDIF (e.g. the EDIF cell name "AND2" which comprises a two-input AND gate, etc.) and some details about the EDIF format that may vary from one synthesis tool to the other. The conversion from EDIF into a standardized netlist format may be done in a standard process 507. The final output of the EDIF reader tool 502 may be a synchronous netlist 508. The synchronous netlist 508 may then be converted to an asynchronous netlist 504 using the synchronous to asynchronous conversion module 503. The resulting asynchronous implementation may be equivalent to the synchronous one in terms of the computations performed.

As is known in the art, the .conf file in tool 502 may comprise a configuration file used to specify the output format of the synthesis tool, while the .xl file may be a library file containing the description of the library elements used by the synthesis tool. The .anf file contains the resulting synchronous netlist 508. Any file formats can be used to specify this information, or the information could be built into the conversion tool 507 itself. The synchronous netlist 508 may then be converted to an asynchronous netlist 504 using the synchronous to asynchronous conversion module 503, the asynchronous format, for example, in the form of a dataflow graph. The resulting asynchronous implementation may be equivalent to the synchronous one in terms of the computation performed.

The described conversion system may operate to generate annotations that translate the performance characteristics of the asynchronous implementation back into the synchronous domain using an annotation generator 505 for validating the timing design of the dataflow graph according to the specifications of the original synchronous representation. This can be performed, for example, by the simulation block 520.

The conversion system 500 described above enables the conversion of a synchronous netlist into an asynchronous implementation, as well as the generation of an annotation that maps the performance characteristics from the asynchronous domain into the synchronous domain. The synchronous netlist may be converted into other formats, in addition to a dataflow graph, including the detailed description of the implementation of the dataflow graph using Verilog or VHDL, or even other high-level languages such as SystemC, Handel C, or C augmented with message-passing operations. The details of the language are not restrictive, as will be evident to a person of ordinary skill in the art after reading this disclosure.

The target asynchronous netlist represents circuits that can be implemented efficiently as fine-grained asynchronous pipelines or synchronous dataflow pipelines. The target netlist may be represented as a dataflow graph.

Operators in the dataflow graph receive tokens on their inputs and produce tokens on their outputs. The change in the value of the token may be used to compute results. Connectivity between operators may be specified by arrows that correspond to communication channels along which tokens can be sent and received. Communication channels may not be buffered, so that sending and receiving a token on a channel corresponds to rendezvous synchronization. The basic building blocks of a dataflow graph are shown in and described now with respect to FIG. 6

Figure 6:
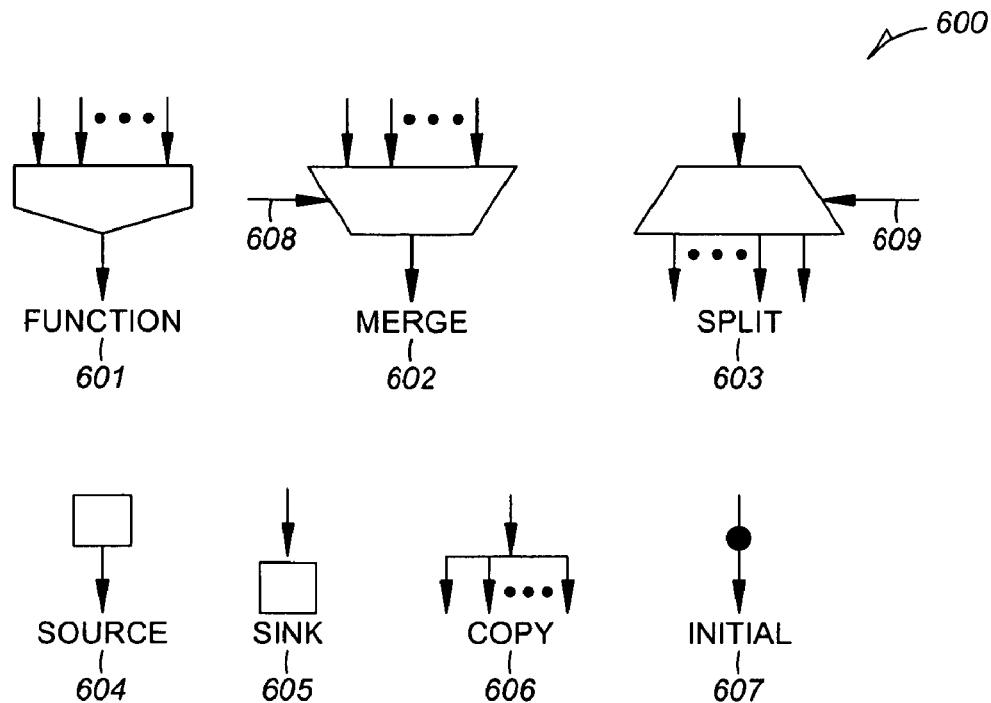
FIG. 6 is a diagram illustrating asynchronous dataflow blocks for converting synchronous netlists to corresponding asynchronous netlists, according to various embodiments of the invention.

FIG. 6 is a diagram illustrating asynchronous dataflow blocks 600 for converting a synchronous netlist to a corresponding asynchronous netlist, according to various embodiments of the invention. A unit that can be used for computation may comprise a function block 601, which has an arbitrary number of inputs and one output. The function block 601 receives tokens from at least some of its inputs, computes a specified function, and produces the result of the function as an output token on its output. There can be many different types of function blocks that vary in the number of inputs they have, and in the operations they perform. A source 604 may comprise an operator that generates an infinite stream of tokens on its output that always have the same value. A sink 605 may comprise an operator that consumes any input token.

A copy 606 is block that replicates the token received on its input to all its outputs. An initial block 607 begins by transmitting a token on its output, and thereafter copies any input token to its output. These blocks 601, 604, 605, 606, and 607 repeatedly receive tokens on their respective inputs, and send tokens on their respective outputs. The merge block 602 has two types of inputs: data inputs (like every other block), and a control input 608. The value of the control input 608 specifies the data input from which a token may be received. This token may then be sent on the output of the merge block 602.

A split block 603 has a dual function. It receives a control value on its control input 609, and a data value on its data input. It sends the data value on the output channel specified by the value of the control input. As is known in the art, a data flow graph may comprise a graphical representation of the flow of data through an information system, such as an asynchronous circuit or gate array. As described above, the various elements shown in FIG. 6 may comprise the basic building blocks for constructing data flow graphs, some of which are described below.

Figure 7:
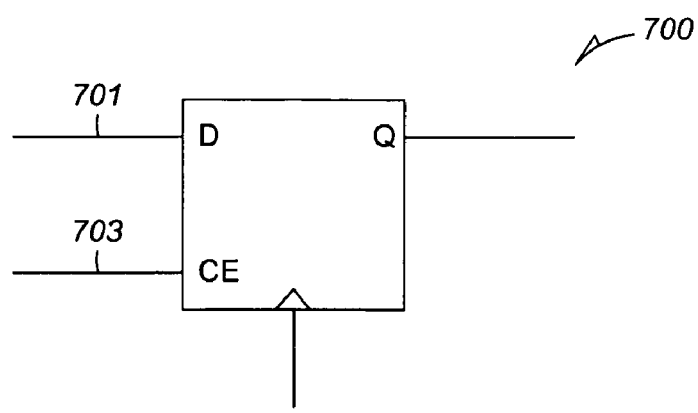
FIG. 7 is a diagram illustrating a synchronous state holding block, according to various embodiments of the invention.

FIG. 7 is a diagram illustrating a synchronous state holding block 700, according to various embodiments of the invention. In converting the synchronous netlist 507 of FIG. 5 into the asynchronous netlist 504 of FIG. 5, when the synchronous netlist 507 contains a state holding block, perhaps comprising a positive edge-triggered flip-flop and combination logic, the transformation may be performed in two operations, as follows: (1) replace every combinational logic gate with a dataflow function block (e.g., dataflow function block 601 of FIG. 6), where the function implements the truth-table of the logic gate; and (2) replace every state holding block (e.g., the positive edge-triggered flip-flop) with an initial block (e.g., initial block 607 of FIG. 6) having an initial token that corresponds to the initial value of the flip-flop. The resulting asynchronous dataflow graph may be a valid implementation of the synchronous circuit, and the operations described above would produce this graph. In the case of state holding blocks coupled to gated clocks, such as the state holding block 700 in FIG. 7, coupled to a data input 701 and a clock enable (CE) signal 703, the conversion may be performed, for example, by eliminating the gating and using a multiplexer (MUX)-transformation as described below with respect to FIG. 8

Figure 8:
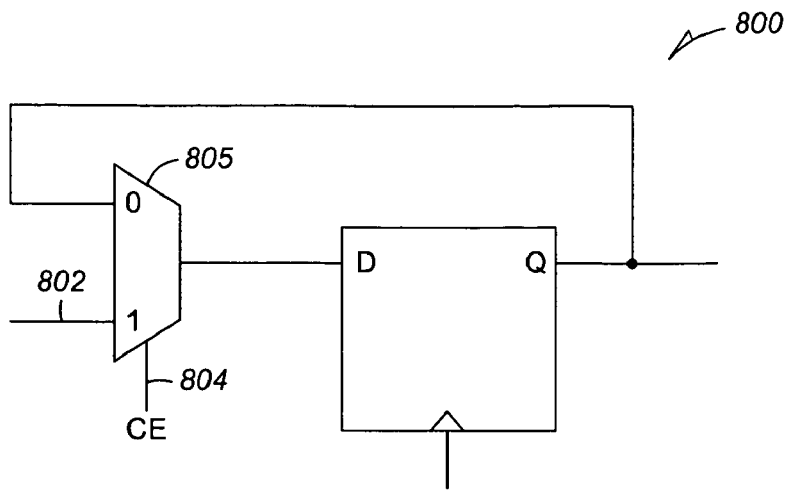
FIG. 8 is a diagram illustrating an asynchronous equivalent of the state holding block shown in FIG. 7, according to various embodiments of the invention.

FIG. 8 is a diagram illustrating an asynchronous equivalent 800 of the state holding block shown in FIG. 7, according to various embodiments of the invention. The asynchronous equivalent 800 of the state holding block 700 includes the MUX 805 (e.g., the merge dataflow block 602 of FIG. 6). The original output Q, i.e., the output Q of the state holding block 700 of FIG. 7, may be connected to the "0" input of the MUX 805. The original input 802, i.e., the input 701 of FIG. 7, may be connected to the "1" input of the MUX 805. Finally, the original CE signal, i.e., the CE signal 703 of FIG. 7 may be connected to the control input 804 of the MUX 805.

The asynchronous equivalent 800 implements the same computation as the original state holding block 700 of FIG. 7. In other words, the MUX 805 implements processing in which the output does not depend on the value of some of the input signals. For example, when the CE signal connoted to the control input 804 is low, the output of the MUX does not depend on the signal 802. Similarly, when CE signal is high, the output does not depend on the value of signal Q.

Figure 9:
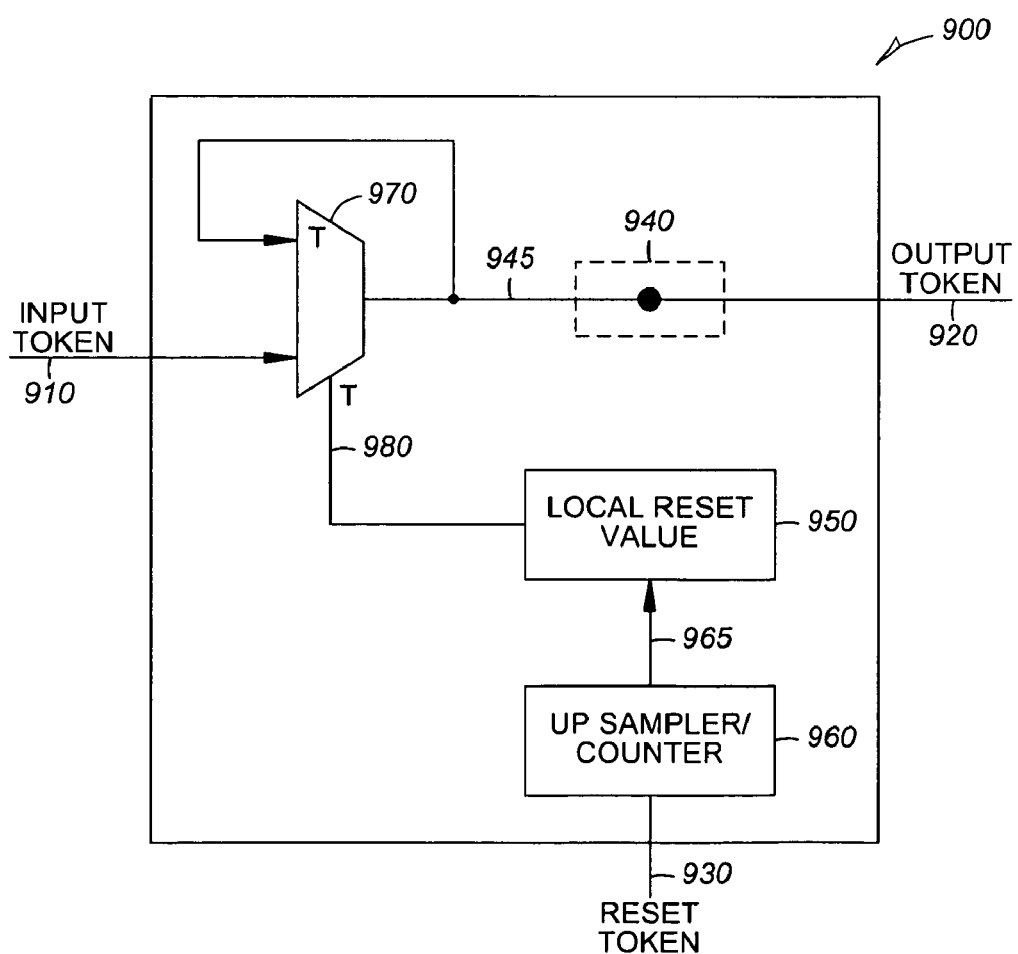
FIG. 9 is a diagram illustrating modified asynchronous dataflow blocks corresponding to the state holding blocks shown in FIG. 2, according to various embodiments of the invention.

FIG. 9 is a diagram illustrating modified asynchronous dataflow block 900 of the state holding blocks 250 shown in FIG. 2, according to various embodiments of the invention. The modified asynchronous dataflow block 900 may be considered as a modified version of an initial block. The modified asynchronous dataflow block 900 may include an initial block 940 that corresponds to the state holding block 250 as well as other blocks that perform frequency conversion, including an upsampler 960, a local reset value register 950, and a MUX 970. The input token 910 and the output token 920 may comprise the original input and output tokens of the state holding block 250 of FIG. 2 and the replicated reset token 930 represents the replicated reset signal distributed to the reset input of the state holding block 250.

The upsampler 960 converts the operational frequency of the replicated reset tokens 930 back to its original frequency (e.g., substantially the same as the operational frequency of the reset signal). The upsampler 960 may also update the local reset value register 950 with the current value 965 of the replicated reset token (e.g., the upsampled replicated reset token). The upsampler 960 may be implemented by one or more counters as is known by one of ordinary skill in the art. In an example embodiment, two or more of the modified asynchronous dataflow block 900 may operate to share upsamplers and/or local reset value registers 950.

The MUX 970 may be controlled by the local reset value at its control input 980. For example, when the local reset value is logically true, the MUX 970 may produce a MUX output token with the same value as the initial token (e.g., the previous value of the input 945 of the initial t block 940), which may then be copied by the initial block 940 to the output token 920. Otherwise, the MUX 970 may produce a MUX output token with the same value as the input token 910 just received. Operation in a reverse fashion (e.g., a logical false reset value produces a MUX output token with the same value as the input token) is also possible. This MUX output may be copied to output token 920 by the initial block 940.

Figure 10:
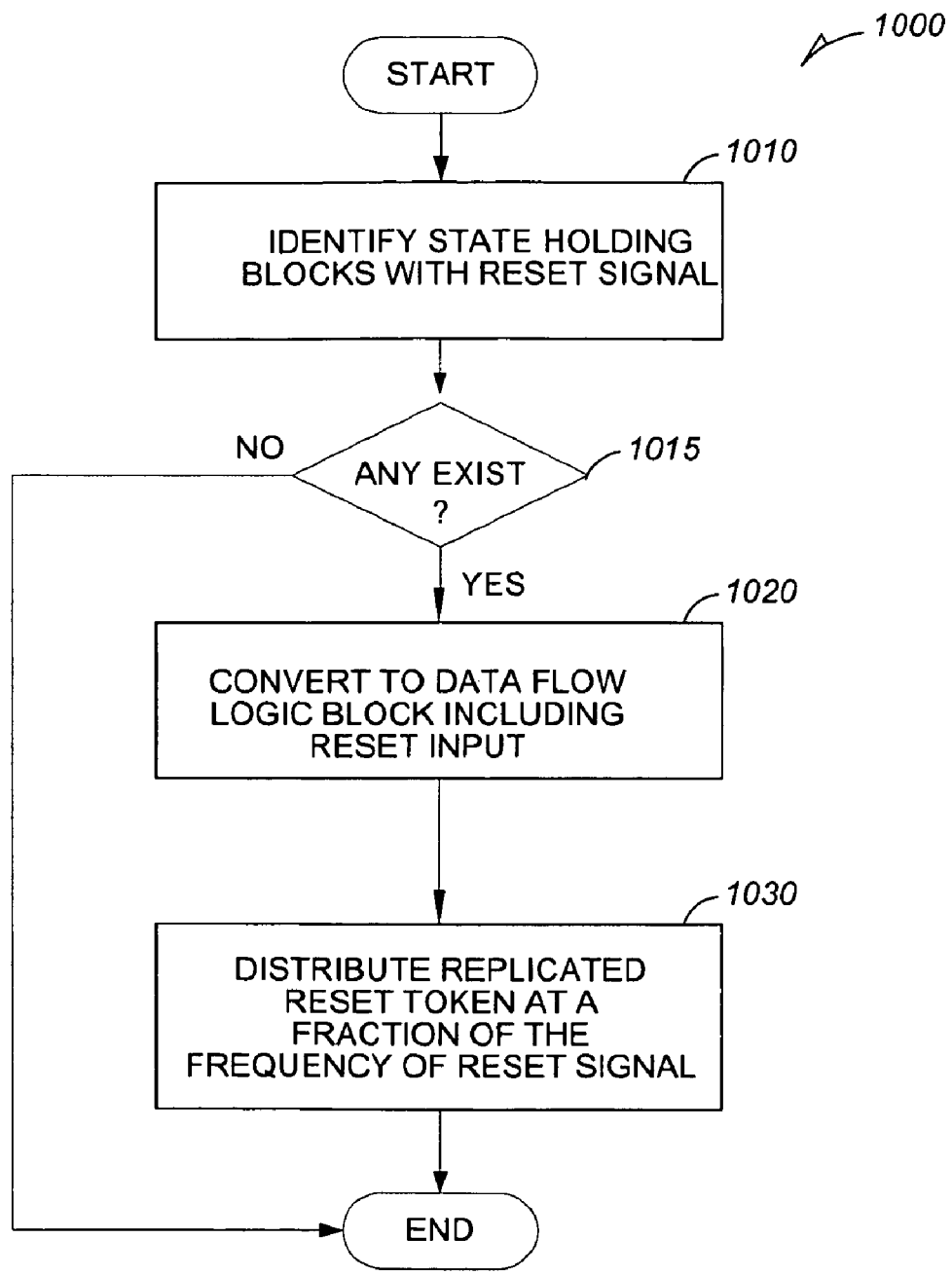
FIG. 10 is a flow diagram illustrating a method of converting a reset mechanism in a synchronous circuit design into a corresponding asynchronous representation, according to various embodiments of the invention.

FIG. 10 is a flow diagram illustrating a method 1000 of converting a reset mechanism in a synchronous circuit design into a corresponding asynchronous representation, according to various embodiments of the invention. At operation 1010, a processor (e.g. the processor 1160 of FIG. 11) may identify synchronous state holding blocks 150 of FIG. 1 that include reset signals such as the reset signal 120 of FIG. 1, connected to their reset inputs. At decision block 1015, if the processor can not identify such a state holding block, the method 1000 may be terminated. Otherwise, at operation 1020, the synchronous to asynchronous converter module 503 of FIG. 5 may convert each of the synchronous state holding blocks 150 to corresponding asynchronous dataflow logic block 250 of FIG. 2 that includes a reset input that receives the reset signal 220 of FIG. 2.

At operation 1030, the replicated reset token 320 may be distributed to the location of the asynchronous dataflow logic blocks 350 of FIG. 3. The operational frequency of the replicated reset token 320 of FIG. 3 may be a fraction of the operational frequency of the reset signal 120 of FIG. 1. Some of the synchronous state holding blocks such as the ones included in logic circuits 480 of the FIG. 4, may be identified by the processor 1160 of FIG. 11 as having an asynchronous reset signal (e.g., a synchronous reset signal 485 of FIG. 4). The clock converter 450 of FIG. 4 may convert the operational frequency of the asynchronous reset signal 430 of FIG. 4 to an operational frequency of a clock domain corresponding to the asynchronous state holding blocks included in the logic circuits 480. Any of the methodologies discussed above, and in other parts of this description, may be executed by a processor 1160 of a system 1100 discussed below.

Figure 11:
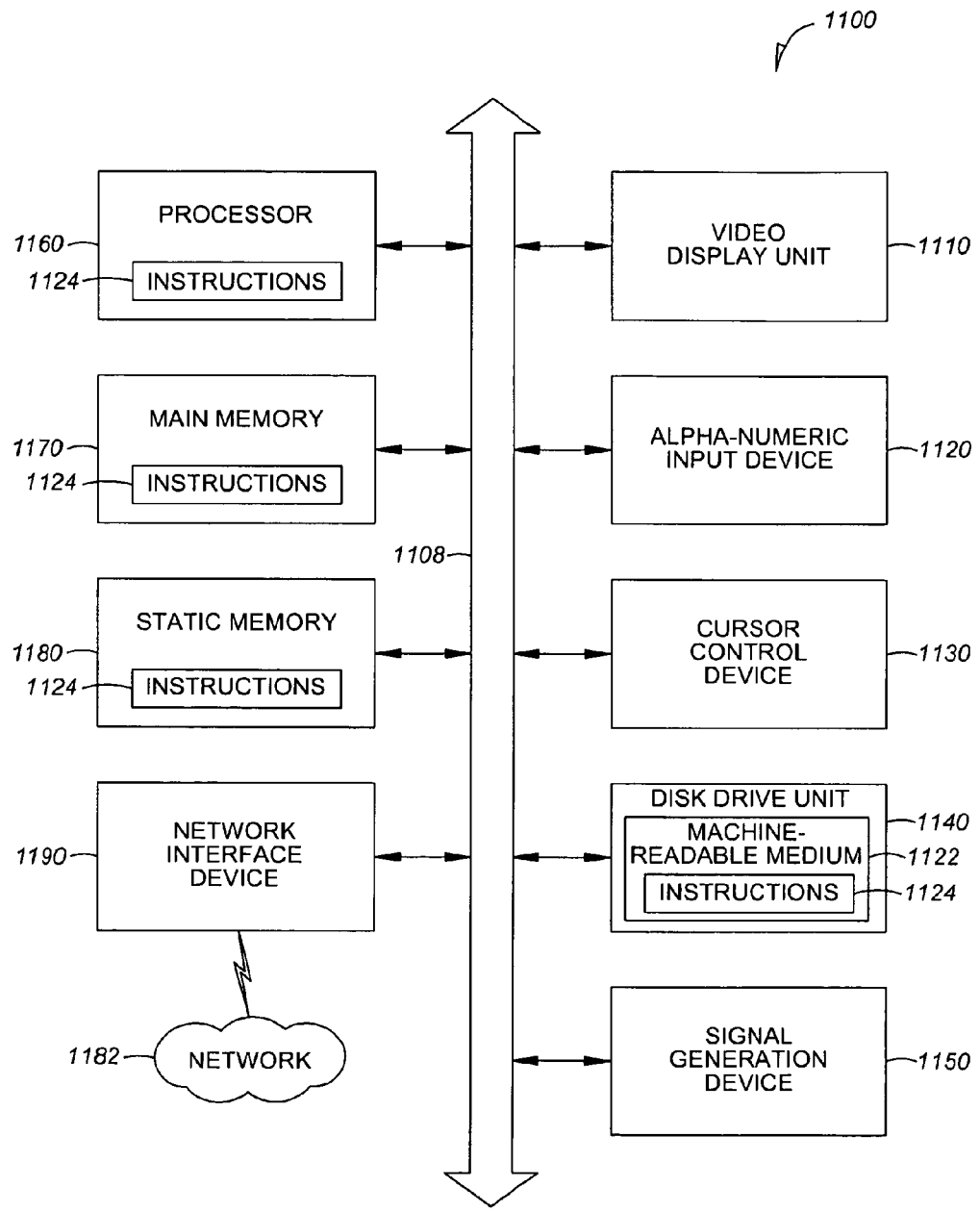
FIG. 11 shows, a diagram illustrating a system, according to various embodiments of the present invention.

FIG. 11 shows, a diagram illustrating a system 1100, according to various embodiments of the present invention. The system 1100 comprises a set of instructions that can be executed to cause the system 1100 to perform any one or more of the methodologies discussed herein. In alternative embodiments, the system 1100 may operate as a standalone device or may be connected (e.g., networked) to other systems. In a networked deployment, the system 1100 may operate in the capacity of a server or a client system in a server-client network environment or as a peer system in a peer-to-peer (or distributed) network environment. System 1100 may be realized as a specific machine in the form of a computer.

The system 1100 may be a server computer, a client computer, a personal computer (PC), a tablet PC, or any system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

The example system 1100 may include the processor 1160 (e.g., a central processing unit (CPU), a graphics processing unit (GPU) or both), a main memory 1170 and a static memory 1180, all of which communicate with each other via a bus 1108. The system 1100 may further include a video display unit 1110 (e.g., a liquid crystal display (LCD) or cathode ray tube (CRT)). The system 1100 also may include an alphanumeric input device 1120 (e.g., a keyboard), a cursor control device 1130 (e.g., a mouse), a disk drive unit 1140, a signal generation device 1150 (e.g., a speaker), and a network interface device 1190.

The disk drive unit 1140 may include a machine-readable medium 1122 on which may be stored one or more sets of instructions (e.g., software) 1124 embodying any one or more of the methodologies or functions described herein. The instructions 1124 may also reside, completely or at least partially, within the main memory 1170 and/or within the processor 1160 during execution thereof by the system 1100, with the main memory 1170 and the processor 1160 also constituting machine-readable media. The instructions 1124 may further be transmitted or received over a network 1182 via the network interface device 1190.

While the machine-readable medium 1022 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium capable of storing, encoding, or carrying a set of instructions for execution by the machine and that cause the machine to perform any one or more of the methodologies of the present technology. The term "machine-readable medium" shall accordingly be taken to include, but not be limited to tangible media, including solid-state memories and optical and magnetic media.

Various embodiments for converting reset mechanisms in a synchronous circuit design into a corresponding asynchronous representation have been described. Implementing such circuits may result in reduced power consumption, reduced die area, and increased processing speed. Although the present embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
    identifying, from a synchronous circuit design, each of a plurality of synchronous state holding blocks that includes a reset signal;
    converting, using one or more processors, each of the plurality of synchronous state holding blocks to a corresponding asynchronous dataflow logic block that includes a reset input to generate an asynchronous circuit design that is equivalent to the synchronous circuit design; and
    distributing to a location of the asynchronous dataflow logic block a replicated reset token, an operational frequency of the replicated reset token being a fraction of an operational frequency of the reset signal.

2. The method of claim 1, wherein the identifying further comprises:
    identifying at least one of the plurality of synchronous state holding blocks that includes an asynchronous reset signal.

3. The method of claim 2, further comprising converting an operational frequency of the asynchronous reset signal to an operational frequency of a clock domain corresponding to the at least one of the plurality of synchronous state holding blocks.

4. The method of claim 1, further comprising:
    upsampling the replicated reset token at the location of the asynchronous dataflow logic block; and
    providing, at the reset input of the asynchronous dataflow logic block, an upsampled reset token.

5. The method of claim 4, wherein the providing of the upsampled reset token comprises:
    providing the upsampled reset token at an operational frequency substantially the same as the operational frequency of the reset signal.

6. The method of claim 1, wherein the distributing of the replicated reset token comprises:
    distributing the replicated reset token to operate at a fraction of the operational frequency of the reset signal, the fraction being at least one of a fixed or a programmable variable.

7. The method of claim 1, wherein the converting comprises:
    converting each of the plurality of synchronous state holding blocks to at least one modified initial block that includes at least one of an upsampler or a local reset value register that operates to store a reset value corresponding to a current value of the replicated reset token.

8. The method of claim 1, wherein the reset input comprise: a signal that is same as the reset signal.

9. The method of claim 1, wherein the distributing comprises:
    reducing an operation frequency of the reset input by a fixed or a programmable factor to generate the replicated reset token.

10. A system comprising:
    memory to store reset signal information; and
    a processor communicatively coupled to the memory, the processor configured to:

identify, from a synchronous circuit design, each of a plurality of synchronous state holding blocks that includes a reset signal associated with the reset signal information;

convert each of the plurality of synchronous state holding blocks to a corresponding asynchronous dataflow logic block that includes a reset input to generate an asynchronous circuit design that is equivalent to the synchronous circuit design; and distribute to a location of the asynchronous dataflow logic block a replicated reset token, an operational frequency of the replicated reset token being a fraction of an operational frequency of the reset signal.

11. The system of claim 10, wherein the processor is configured to:

identify each of the plurality of synchronous state holding blocks that includes an asynchronous reset signal.

12. The system of claim 11, further comprising:

a converter to convert an operational frequency of the asynchronous reset signal to an operational frequency of a clock domain corresponding to the at least one of the plurality of synchronous state holding blocks.

13. The system of claim 10, further comprising:

an upsampler to upsample the replicated reset token at the location of the asynchronous dataflow logic block and provide an upsampled reset token at the reset input of the asynchronous dataflow logic block.

14. The system of claim 13, wherein the upsampler is to upsample the replicated reset token to an operational frequency substantially the same as the operational frequency of the reset signal.

15. The system of claim 10, wherein the asynchronous dataflow logic block comprises:

at least one modified initial block that includes at least one of an upsampler or a local reset value register that stores a reset value corresponding to a current value of the replicated reset token.

16. The system of claim 10, further comprising:

a display unit to display the asynchronous dataflow logic block.

17. An integrated circuit comprising:

a plurality of asynchronous logic circuits, at least one of the plurality of asynchronous logic circuits implementing an asynchronous dataflow logic block that corresponds to at least one of a synchronous state holding block of a synchronous circuit that is coupled to a reset signal, the asynchronous dataflow logic block having a reset input or a reset line that distributes a replicated reset token to a location of the asynchronous dataflow logic block, an operational frequency of the replicated reset token being a fraction of an operational frequency of the reset signal.

18. The integrated circuit of claim 17, wherein the synchronous state holding block of the synchronous circuit is coupled to an asynchronous reset signal.

19. The integrated circuit of claim 18, wherein at least one of the plurality of asynchronous logic circuits comprises:

a converter to convert an operational frequency of the asynchronous reset signal to an operational frequency of a clock domain including at least one of the synchronous state holding blocks.

20. The integrated circuit of claim 17, wherein at least one of the plurality of asynchronous logic circuits implements the asynchronous dataflow logic block that corresponds to an upsampler that operates to upsample the replicated reset token to provide an upsampled reset token at the location of the asynchronous dataflow logic block.

21. The integrated circuit of claim 17, wherein the upsampled reset token has an operational frequency substantially the same as the operational frequency of the reset signal.

22. The integrated circuit of claim 17, wherein the asynchronous dataflow logic block comprises at least one modified initial block that includes at least one of an upsampler or a local reset value register that operates to store a reset value corresponding to a current value of the replicated reset token.

23. A machine-readable device storing instructions, which when executed by a machine cause the machine to perform operations comprising:

identifying, from a synchronous circuit design, each of a plurality of synchronous state holding blocks that includes a reset signal;

converting each of the plurality of synchronous state holding blocks to a corresponding asynchronous dataflow logic block that includes a reset input to generate an asynchronous circuit design that is equivalent to the synchronous circuit design; and distributing to a location of the asynchronous dataflow logic block a replicated reset token, an operational frequency of the replicated reset token being a fraction of an operational frequency of the reset signal.

24. The machine-readable device of claim 23, wherein the operations further comprise:

upsampling the replicated reset token at the location of the asynchronous dataflow logic block; and providing, at the reset input of the asynchronous dataflow logic block, an upsampled reset token.

* * * * *